United States Patent
Sakamoto et al.

Patent Number: 5,840,117
Date of Patent: Nov. 24, 1998

[54] METHOD FOR SURFACE FLATTENING A CRYSTAL SUBSTRATE

[75] Inventors: Kunihiro Sakamoto; Atsushi Ando, both of Tsukuba, Japan

[73] Assignee: Agency of Industrial Science & Technology, Tokyo, Japan

[21] Appl. No.: 702,036

[22] Filed: Aug. 23, 1996

[30] Foreign Application Priority Data

Sep. 28, 1995 [JP] Japan ................................. 7-250270

[51] Int. Cl.$^6$ .................................................. C30B 33/04
[52] U.S. Cl. ............................... 117/62; 117/63; 117/902
[58] Field of Search ................................. 117/84, 90, 94, 117/97, 62, 63, 902; 437/107, 133

[56] References Cited

U.S. PATENT DOCUMENTS 5,571,748  11/1996  Miyazawa et al. .................. 437/107

OTHER PUBLICATIONS

M. Ichikawa et al, "Observation of electromigration effect upon Si–MBE growth on Si (001) surface", Vacuum/vol. 41/No. 4–6, pp. 933–937/1990.

N. Inoue et al, "In situ observation by ultrahigh vacuum reflection electron microscopy of terrace formation processes on (100) silicon surfaces during annealing", Appl. Phys. Lett. 55 (14), Oct. 2, 1989, pp. 1400–1402.

Tsunenori Sakamoto et al, "Si (001) –2X1 Single–Domain Structure Obtained by High Temperature Annealing", Japanese Journal of Applied Physics, vol. 25, No. 1, Jan. 1986, pp. L78–L80.

Naohisa Inoue et al, "UHV–REM Study of Changes in the Step Structures on Clean (100) Silicon Surfaces by Annealing", Japanese Journal of Applied Physics, vol. 26, No. 4, Apr. 1987, pp. L293–L295.

*Primary Examiner*—Felisa Garrett
*Attorney, Agent, or Firm*—Spencer & Frank

[57] ABSTRACT

A method for surface flattening a crystal substrate includes (a) processing a surface of a silicon single crystal substrate, the surface deviating by 0.1° or less from the (001) plane, so as to form a processed zone thereon which is an obstacle to the movement of surface steps present on the surface of the silicon single crystal substrate and which is adjacent to a preselected region having a surface to be flattened when viewed on an atomic level; (b) holding the substrate processed in step (a) in a chamber having an adjustable degree of vacuum so that the substrate has a temperature which is controlled by direct-current passage and heating; and (c) heating the substrate to move the surface steps along the substrate from the preselected region and gather the surface steps in the processed zone, thereby forming a flat surface in the preselected region of the substrate when viewed on the atomic level. In one embodiment, the direction of direct-current passage is displaced from the [1 1 0] and [1 1 0] directions, whereby the surface of the preselected region is flattened in all directions of the substrate surface.

7 Claims, 7 Drawing Sheets

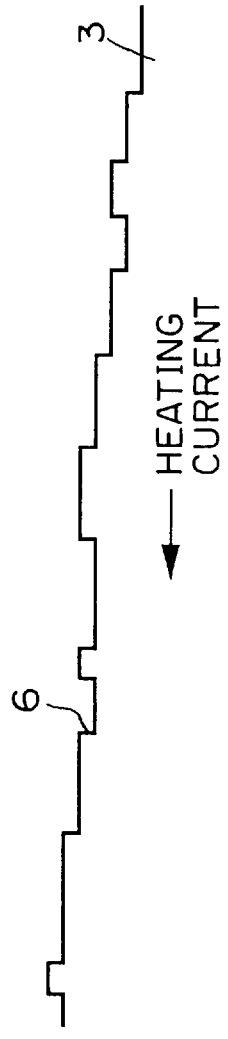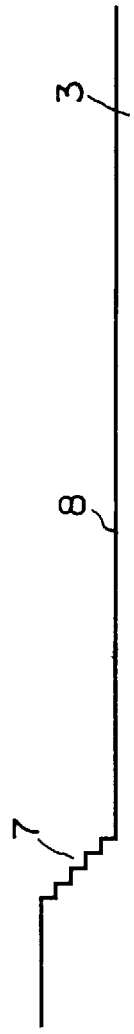
FIG.2A (PRIOR ART) BEFORE CURRENT PASSAGE AND HEATING
FIG.2B (PRIOR ART) AFTER CURRENT PASSAGE AND HEATING

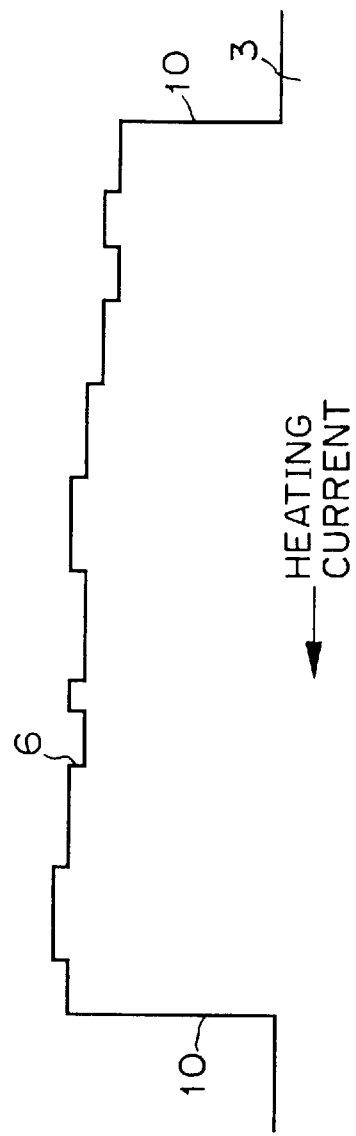
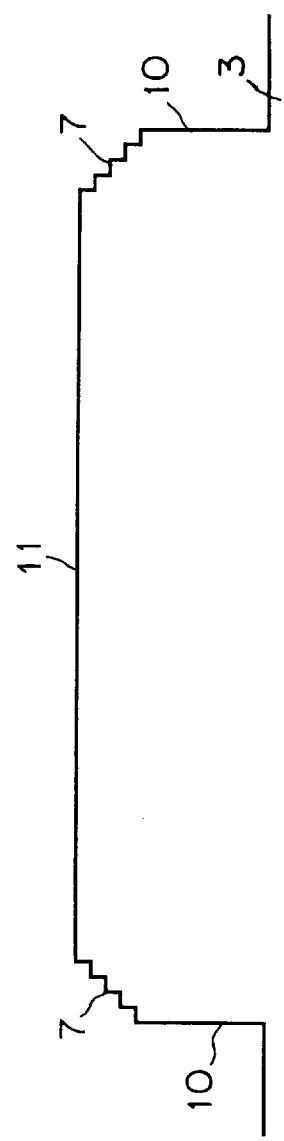
FIG.4A BEFORE CURRENT PASSAGE AND HEATING
FIG.4B AFTER CURRENT PASSAGE AND HEATING

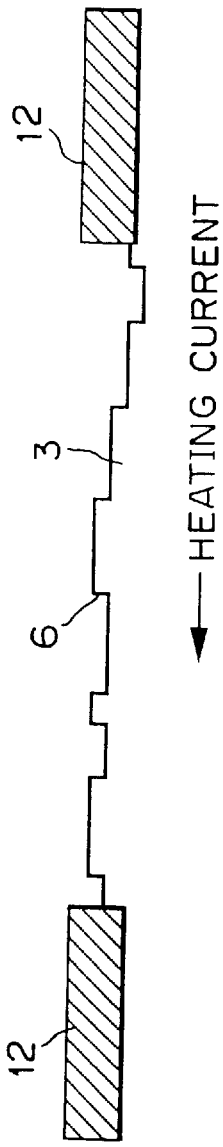
FIG.6 BEFORE CURRENT PASSAGE AND HEATING
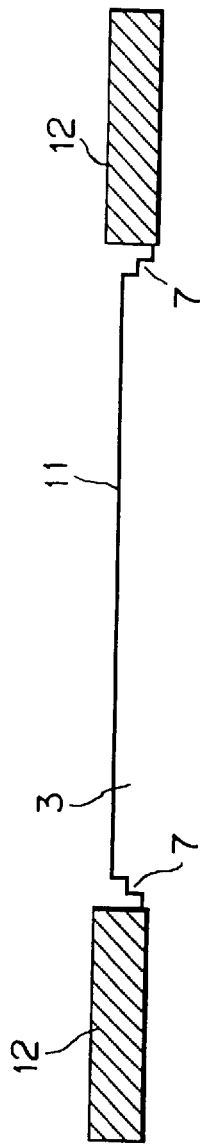
FIG.7 AFTER CURRENT PASSAGE AND HEATING

METHOD FOR SURFACE FLATTENING A CRYSTAL SUBSTRATE

BACKGROUND OF THE INVENTION

1. Field of the Invention

The present invention relates to a method for flattening, on the atomic layer level, the surface of a silicon single crystal substrate for producing microminiaturized high performance electronic devices.

2. Description of the Prior Art

With the progress of microminiaturization of electronic devices using a silicon single crystal substrate, the elimination of surface roughness of the silicon substrate on the atomic layer level is of importance for improving the performance of the silicon-based electronic devices.

A mirror-polished surface has so far been obtained by grinding the silicon substrate having the (001) plane, and chemically treating the ground surface in an aqueous solution. On the atomic phase level, however, the resulting surface was markedly rough.

Prior knowledge has been that many atomic layer steps gather to form giant steps, and a terrace flat on the atomic layer level is obtained over a width of several micrometers between the giant steps when the silicon substrate is heat-treated in ultra high vacuum with electric current being passed in the [1 1 0]-direction (M. Ichikawa and T. Doi: Vacuum, 41(1990), 933).

This conventional method for forming giant steps by heating with current passage, however, cannot control the position on the substrate where the giant steps should be formed, and a desired region for the formation of a silicon-based election device cannot be flattened on the atomic layer level.

With the conventional method involving heating with current passage in the [1 1 0] direction, furthermore, many atomic layer steps gather in the [1 1 0] direction to form giant steps, but the atomic layer steps do not gather in the [1 $\bar{1}$ 0] direction, which is perpendicular to the direction of heating current, so that a surface flat on the atomic layer level is obtained only in a band-like region measuring about several micrometers by several tens of nanometers.

SUMMARY OF THE INVENTION

This invention has been accomplished in an attempt to solve the problems of the conventional methods. The invention aims at providing a method for surface flattening of a crystal substrate, which method can form a surface flat on the atomic layer level with a large area measuring about several micrometers by several micrometers in a desired region on a silicon substrate having the (001) plane.

This crystal surface flattening method of the present invention involves processing a surface of a silicon single crystal, the surface deviating by 0.1° or less from the (001) plane, so as to form an obstacle to the movement of surface steps, and holding the processed substrate in a chamber having an adjustable degree of vacuum so that the temperature of the substrate can be controlled by direct-current passage and heating.

The substrate is heated by the direct-current passage, and steps existing on the surface of the substrate are gathered in the processed zone that impedes the movement of the steps. In addition, the direction of direct-current passage is displaced from both directions [1 1 0] and [1 $\bar{1}$ 0], thereby the movement and gathering of the surface steps are induced in both directions [1 1 0] and [1 $\bar{1}$ 0] of the substrate crystal, and the surface is flattened in all directions.

According to the present invention, the surface steps move upon the direct-current flowing and heating of the substrate. Once these surface steps reach the site of processing which acts as an obstacle to their improvement, they cannot move any more. As a result, many surface steps gather at the processed region, and a surface flat on the atomic layer level is formed in a desired region of the substrate surface.

By displacing the direction of direct-current passage from the directions [1 1 0] and [1 $\bar{1}$ 0], the current has components parallel to the directions [1 1 0] and [1 $\bar{1}$ 0]. Consequently, the movement and gathering of the surface steps can be induced in both directions [1 1 0] and [1 $\bar{1}$ 0], and the surface can be flattened in all directions in a desired region of the substrate surface.

The above and other objects, effects, features and advantages of the present invention will become more apparent from the following description of embodiments thereof taken in conjunction with the accompanying drawings.

BRIEF DESCRIPTION OF THE DRAWINGS

FIGS. 2A and 2B explain a conventional method for forming a flat plane on the surface of a crystal, in which 2A is a sectional structural view of the substrate surface before heating of the substrate, and 2B is a sectional structural view of the substrate surface after heating of the substrate;

FIGS. 4A and 4B explain a method for surface flattening of a crystal substrate according to the present invention, in which 4A is a sectional structural view of the substrate surface before heating of the substrate, and 4B is a sectional structural view of the substrate surface after heating of the substrate;

FIG. 6 is a sectional structural view of the substrate surface before heating of the substrate for illustrating a third embodiment of the present invention, which involves covering a part of the substrate surface with a silicon dioxide film as a method for processing the substrate surface so as to serve as an obstacle to the movement of the surface steps;

FIG. 7 is a sectional structural view of the substrate surface after heating of the substrate for illustrating the third embodiment of the present invention, which involves covering a part of the substrate surface with a silicon dioxide film as a method for processing the substrate surface so as to serve as an obstacle to the movement of the surface steps.

DETAILED DESCRIPTION OF PREFERRED EMBODIMENTS

The embodiments of the present invention will be described with reference to the drawings, which are provided for the purpose of illustration only, and in no way limit the present invention.

Figure 1:
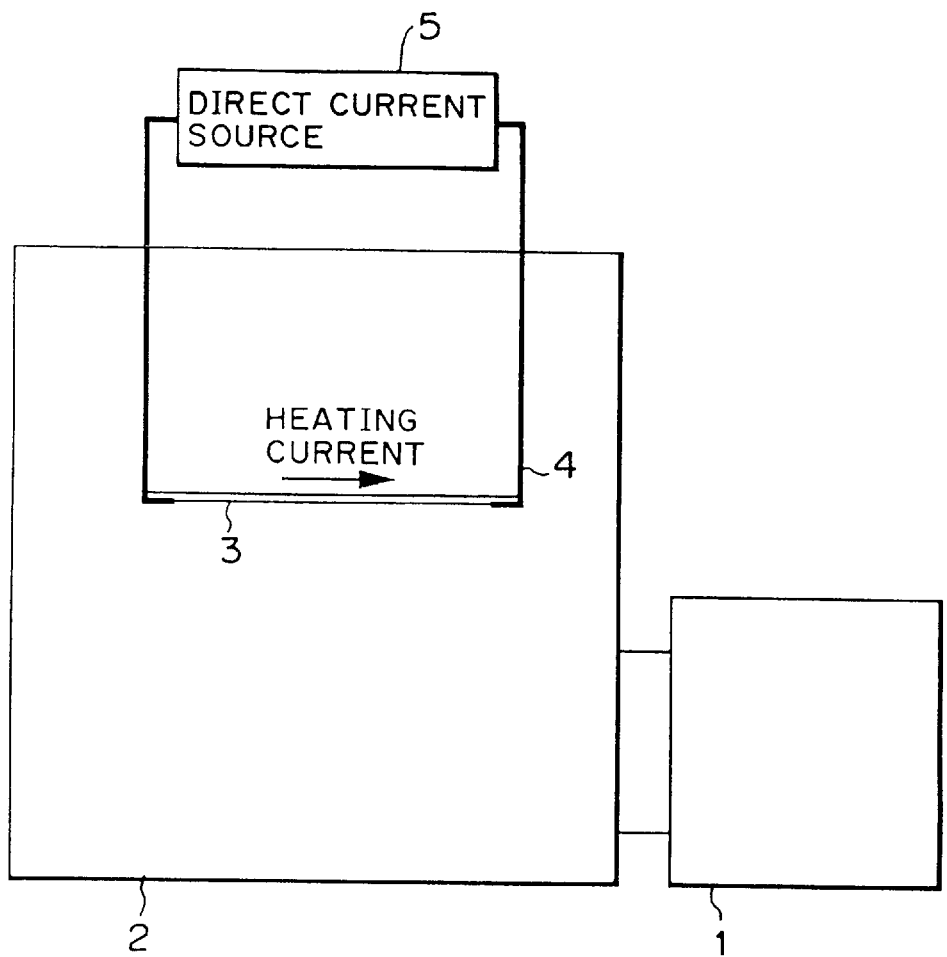
FIG. 1 is a block diagram showing an embodiment of a vacuum-heatable apparatus for surface flattening of crystal substrate using in a method for surface flattening of a crystal substrate according to the present invention.
Figure 3:
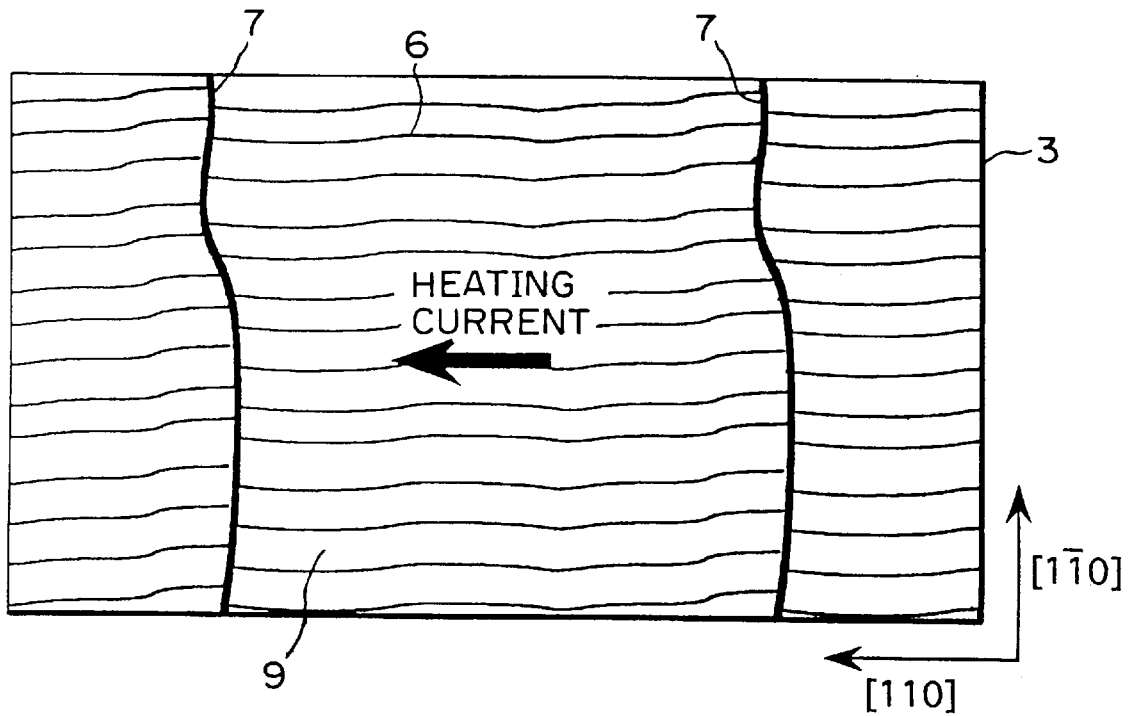
FIG. 3 is a structural plan view of the substrate surface after heating of the substrate, as a view illustrating a conventional method for forming a flat plane on the crystal surface.

FIG. 1 shows an embodiment of an apparatus for use in a method for surface flattening of a crystal substrate according to the present invention. This crystal surface flattening apparatus has a vacuum chamber 2 whose degree of vacuum is adjusted by an exhaust system 1. A holder 4 for holding a silicon substrate 3 is provided in the vacuum chamber 2. A direct current can be applied to the silicon substrate 3 by a direct current source 5 via the holder 4 to hold the silicon substrate 3 at a necessary temperature.

EMBODIMENT 1

Next, the principle of the method for surface flattening of the crystal substrate in accordance with the present invention will be described by reference to FIG. 2 to FIG. 5.

With the prior art, the following phenomena have been known: As shown in the sectional views FIG. 2A and FIG. 2B, when a silicon substrate 3 is heat-treated in an ultra-high vacuum with electric current being passed in the [1 1 0] direction of the substrate crystal, numerous atomic phase steps 6 existing on the substrate surface before current passage and heating gather to form giant steps 7. Between these giant steps 7 and 7, a surface region (a terrace-like surface) 8 flat at the atomic layer level is obtained over a width of several micrometers.

This conventional method, however, cannot control the position on the substrate surface where the giant steps 7 should be formed.

With the conventional method involving heating with a direct-current passage in the [1 1 0] direction of the substrate crystal, furthermore, many atomic layer steps 6 gather to form giant steps 7 in the direction [1 1 0]. In the [1 $\bar{1}$ 0] direction, which is perpendicular to the direction of application of the heating current, on the other hand, atomic phase steps 6 do not gather. As shown in the plan view FIG. 3, there is obtained only a band-like flat surface 9 flat at the atomic phase level, which measures about several micrometers by several tens of nanometers.

The crystal substrate surface flattening method of the present invention, on the other hand, is characterized by involving direct-current passage and heating of a silicon single crystal substrate in ultra-high vacuum, the silicon single crystal substrate having been processed so as to impede the movement of the surface steps. An example of processing for inhibiting the movement of the surface steps is indicated as an example of production of greater cliffs 10 than the giant steps 7 by etching. This example will be explained by way of the sectional views FIG. 4A and FIG. 4B.

Upon heating of a substrate 3 by the application of a direct current, steps 6 on the substrate surface move. When these surface steps 6 reach the processed cliffs 10, they cannot move any longer. At these cliffs 10, many surface steps 6 gather, so that a surface 11 flat on the atomic layer level is formed between the cliff 10 and the other cliff 10 that have been produced by processing.

EMBODIMENT 2

Figure 5:
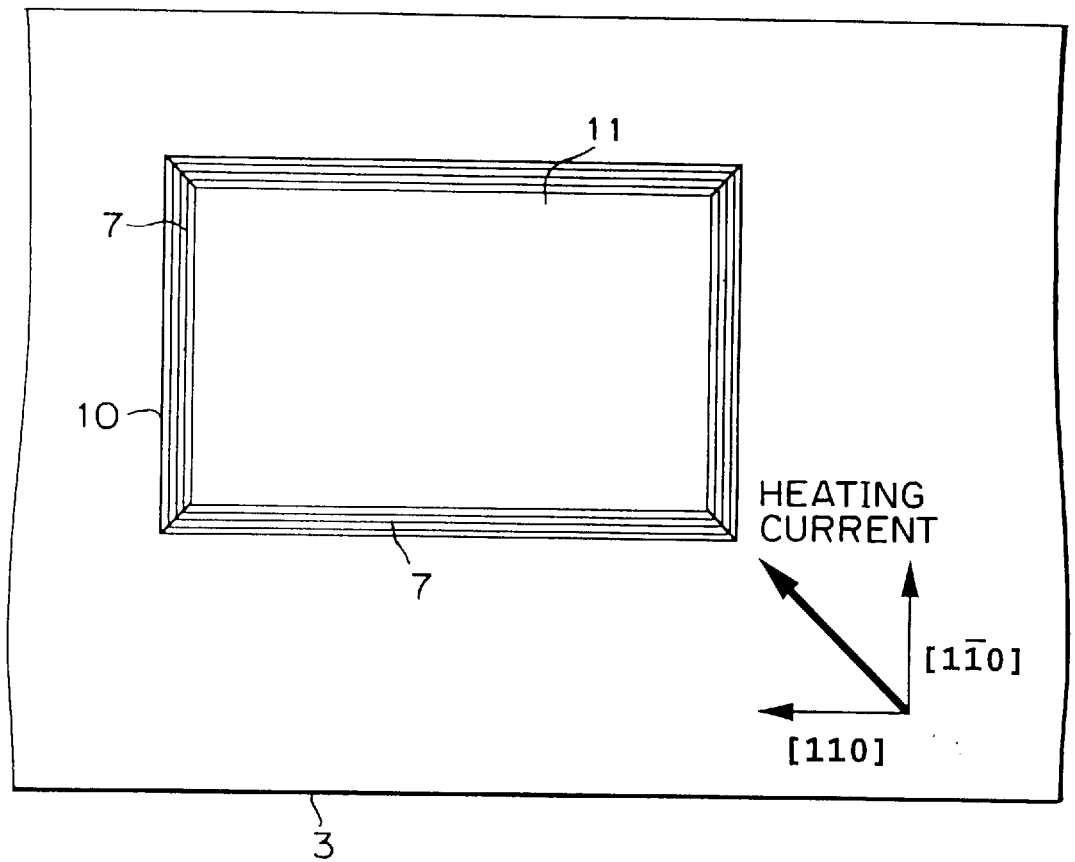
FIG. 5 is a structural plan view of the substrate for illustrating a second embodiment of the present invention in which the direction of direct-current passage is displaced from the directions [1 1 0] and [1 $\bar{1}$ 0] of the substrate crystal.

An embodiment in which the direction of direct-current passage is displaced from the directions [1 1 0] and [1 $\bar{1}$ 0] of the substrate crystal, a second characteristic of the present invention, will be described using FIG. 5.

By displacing the direction of direct-current passage from both directions [1 1 0] and [1 $\bar{1}$ 0] of the substrate crystal, the current has components parallel to the directions [1 1 0] and [1 $\bar{1}$ 0]. Thus, the movement and gathering of the surface steps can be induced in both directions [1 1 0] and [1 $\bar{1}$ 0], whereby the surface can be flattened in all directions.

EMBODIMENT 3

In addition to the foregoing processing for formation of cliffs, the processing method for forming an obstacle to the movement of the surface steps includes a method which comprises covering a part of the surface with a silicon dioxide film or a silicon nitride film, or a method which involves intentionally introducing impurities or surface defects. Either method can form a surface flat at the atomic layer level in a desired region of the crystal substrate surface.

Figure 8:
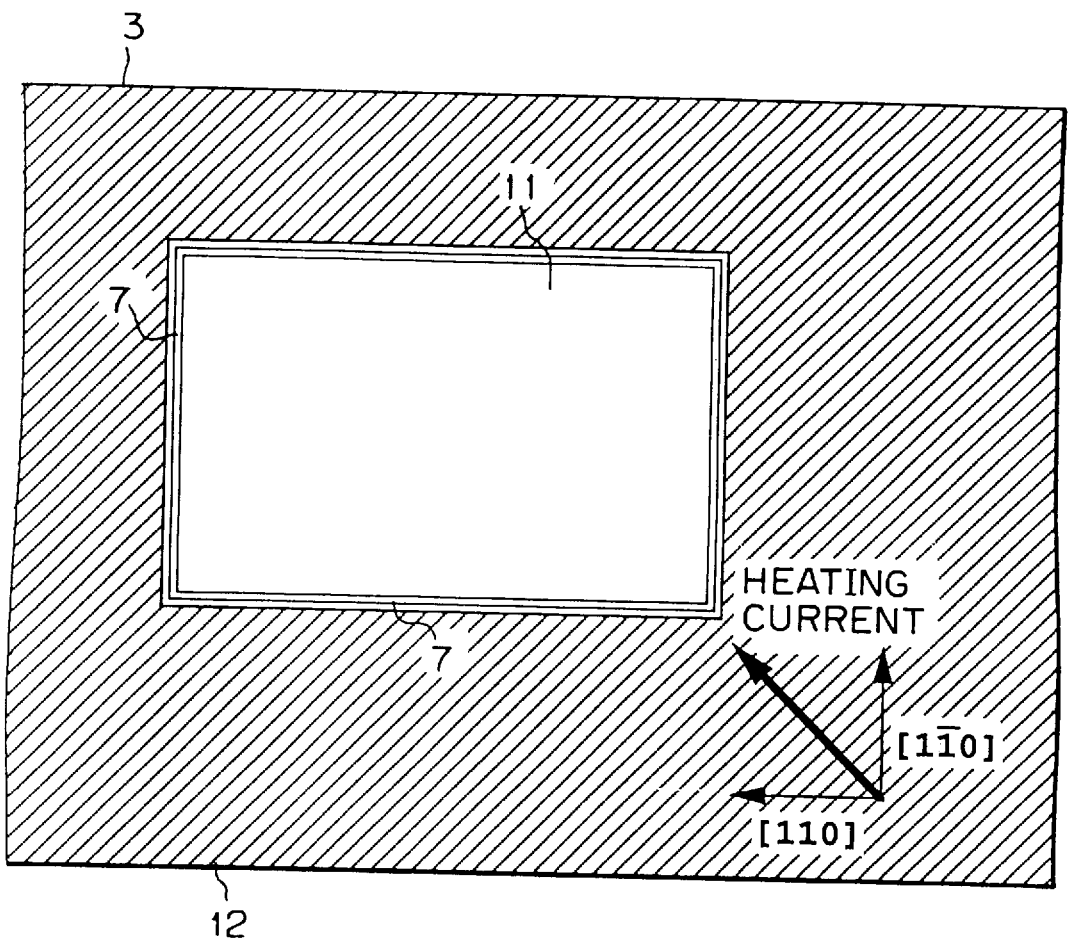
FIG. 8 is a structural plan view of the substrate surface after heating of the substrate for illustrating the third embodiment of the present invention, which involves covering a part of the substrate surface with a silicon dioxide film as a method for processing the substrate surface so as to serve as an obstacle to the movement of the surface steps.

Embodiments using a silicon dioxide film are shown in FIG. 6, FIG. 7 and FIG. 8. As illustrated therein, a silicon dioxide film 12 is overlaid around a desired region (a region to become a flat surface 11) of the surface of a substrate 3. Then, direct current is applied to the substrate 3 in a vacuum chamber to heat the substrate 3. By so doing, many atomic layer steps 6 on the desired region are moved to and gathered at the boundary between the desired region and the silicon dioxide film 12. Consequently, the surface 11 flat on the atomic layer level is formed in the desired region, as shown in FIG. 7 and FIG. 8. The direction of application of the direct current is set to be displaced from the directions [1 1 0] and [1 $\bar{1}$ 0].

As described in the foregoing, the present invention makes it possible to gather surface steps, moving upon heating by application of direct current to the crystal substrate, to positions where processing for forming an obstacle to their movement has been performed. Thus, a hitherto unfeasible silicon (001) plane flat on the atomic phase level, the plane having a large area of about several micrometers by several micrometers, can be formed in a desired region of the substrate surface.

The present invention has been described in detail with respect to preferred embodiments, and it will now be clear that changes and modifications may be made without departing from the invention in its broader aspects, and it is our intention, therefore, in the appended claims to cover all such changes and modifications as fall within the true spirit of the invention.

What is claimed is:

1. A method for surface flattening a crystal substrate, comprising:

a. processing a surface of a silicon single crystal substrate, the surface deviating by 0.1° or less from the (001) plane, so as to form a processed zone thereon which is an obstacle to the movement of surface steps present on the surface of the silicon single crystal substrate and which is adjacent to a preselected region having a surface to be flattened when viewed on an atomic level;

b. holding the substrate processed in step (a) in a chamber having an adjustable degree of vacuum so that the substrate has a temperature which is controlled by direct-current passage and heating; and c. heating the substrate to move the surface steps along the substrate from the preselected region and gather the surface steps in the processed zone, thereby forming a flat surface in the preselected region of the substrate when viewed on the atomic level.

2. The method as claimed in claim 1, wherein the direction of direct-current passage is displaced from the [1 1 0] and [1 1 0] directions, whereby the surface of the preselected region is flattened in all directions of the substrate surface.

3. The method as claimed in claim 1, wherein the surface of the silicon single crystal substrate is processed in step (a) by etching to provide at least one cliff which forms the processed zone.

4. The method as claimed in claim 1, wherein the surface of the silicon single crystal substrate is processed in step (a) by covering at least one area adjacent to the preselected zone with a film to provide the processed zone.

5. The method as claimed in claim 4, wherein the film is comprised of a material selected from the group consisting essentially of silicon dioxide and silicon nitride.

6. The method as claimed in claim 1, wherein the surface of the silicon single crystal substrate is processed in step (a) by introducing impurities into at least one area adjacent to the preselected zone to provide the processed zone.

7. The method as claimed in claim 1, wherein the surface of the silicon single crystal substrate is processed in step (a) by introducing surface defects into at least one area adjacent to the preselected zone to provide the processed zone.

\* \* \* \* \*